(12) United States Patent
Singh et al.

(10) Patent No.: US 7,309,898 B1
(45) Date of Patent: Dec. 18, 2007

(54) METHOD AND APPARATUS FOR PROVIDING NOISE SUPPRESSION IN AN INTEGRATED CIRCUIT

(75) Inventors: Raminderpal Singh, Essex Junction, VT (US); Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,856

(22) Filed: May 20, 2002

(51) Int. Cl.
    *H01L 29/76* (2006.01)

(52) U.S. Cl. .................. 257/372; 257/665; 257/228; 257/230; 257/147; 257/139; 438/48; 438/215; 327/525; 365/225.7

(58) Field of Classification Search ............... 257/228, 257/230, 665, 147, 139, 372; 438/48, 215; 327/525
See application file for complete search history.

(56) References Cited

U.S. PATENT DOCUMENTS

| | | | | |
|---|---|---|---|---|
| 4,791,317 A | | 12/1988 | Winnerl et al. | ......... 307/296 R |
| 4,873,668 A | * | 10/1989 | Winnerl et al. | ......... 365/189.09 |

FOREIGN PATENT DOCUMENTS

| | | | |
|---|---|---|---|
| JP | 58086759 A | 5/1983 |
| JP | 58182863 A | 10/1983 |
| JP | 1223761 A | 9/1989 |
| JP | 2219260 A | 8/1990 |

* cited by examiner

*Primary Examiner*—Sara Crane
*Assistant Examiner*—Junghwa Im
(74) *Attorney, Agent, or Firm*—W. Riyon Harding

(57) ABSTRACT

A method and apparatus for improving the latchup tolerance of circuits embedded in an integrated circuit while avoiding the introduction of noise from such tolerance into the power rails.

5 Claims, 5 Drawing Sheets

METHOD AND APPARATUS FOR PROVIDING NOISE SUPPRESSION IN AN INTEGRATED CIRCUIT

BACKGROUND OF THE INVENTION

1. Field of the Invention

The present invention generally relates to integrated circuits, and more particularly to providing latchup and noise suppression in such integrated circuits.

2. Description of the Related Art

As electronic components are getting smaller and smaller along with the internal structures in integrated circuits, it is getting easier to either completely destroy or otherwise impair electronic components from latchup. Latchup is when a pnpn structure transitions from a low current high voltage state to a high current low voltage state through a negative resistance region (i.e. forming an S-Type I–V (current/voltage) characteristic).

Latchup is typically understood as occurring within a pnpn structure, or silicon controlled rectifier (SCR) structure. Interestingly enough, these pnpn structures can be intentionally designed, or even unintentionally formed between structures. Hence, latchup conditions can occur within peripheral circuits or internal circuits, within one circuit (intra-circuit) or between multiple circuits (inter-circuit).

Latchup is typically initiated by an equivalent circuit of a cross-coupled pnp and npn transistor. With the base and collector regions being cross-coupled, current flows from one device leading to the initiation of the second ("regenerative feedback"). These pnp and npn elements can be any diffusions or implanted regions of other circuit elements (e.g. P-channel MOSFETs, N-Channel MOSFETs, resistors, etc) or actual pnp and npn bipolar transistors. In CMOS, the pnpn structure can be formed with a p-diffusion in a n-well, and a n-diffusion in a p-substrate ("parasitic pnpn"). In this case, the well and substrate regions are inherently involved in the latchup current exchange between regions.

The condition for triggering a latchup is a function of the current gain of the pnp and npn transistors, and the resistance between the emitter and the base regions.

This inherently involves the well and substrate regions. The likelihood or sensitivity of a particular pnpn structure to latchup is a function of spacings (e.g. Base width of the npn and base width of the pnp), current gain of the transistors, substrate resistance and spacings, the well resistance and spacings, and isolation regions.

System-on-a-chip (SOC) solutions have been used for solving the mixed signal (voltage) and radio frequency (RF) requirements of high-speed data rate transmission, optical interconnect, wireless and wired marketplaces. Each of the noted applications has a wide range of power supply conditions, number of independent power domains, and circuit performance objectives. Different power domains are established between digital, analog and radio frequency (RF) functional blocks on an integrated chip. Part of the SOC solution has resulted in different circuit and system functions being integrated into a common chip substrate. The integration of different circuits and system functions into a common chip has also resulted in solutions for ensuring that noise from one portion or circuit of the chip does not affect a different circuit within the chip.

In internal circuits and-peripheral circuitry, latchup and noise are both a concern. Latchup and noise are initiated in the substrate from overshoot and undershoot phenomenon. These can be generated by CMOS off-chip driver circuitry, receiver networks, and ESD devices. In CMOS I/O circuitry, undershoot and overshoot can lead to injection in the substrate. Hence, both a p-channel MOSFET and n-channel MOSFET can lead to substrate injection. Simultaneous switching of circuitry where overshoot or undershoot injection occurs, leads to injection into the substrate which leads to both noise injection and latchup conditions. Supporting elements in these circuits, such as pass transistors, resistor elements, test functions, over voltage dielectric limiting circuitry, bleed resistors, keeper networks and other elements can be present leading to injection into the substrate. ESD elements connected to the input pad can also lead to noise injection and latchup. ESD elements that can lead to noise injection, and latchup include MOSFETs, pnpn SCR ESD structures, p+/n-well diodes, n-well-to-substrate diodes, n+ diffusion diodes, and other ESD circuits. ESD circuits can contribute to noise injection into the substrate and latchup.

Unfortunately, the solutions for reducing noise often result in increasing the likelihood of latchup, and are not reviewed or their effects contemplated with the solutions used for latchup. Conversely, solutions for improving latchup tolerance fail to contemplate the effects on noise.

It would, therefore, be a distinct advantage to have a method and apparatus that improved both noise suppression and latchup tolerance in an integrated circuit. The present invention provides such an apparatus and method.

BRIEF SUMMARY OF THE INVENTION

The present invention is a method and apparatus for improving the latchup tolerance of circuits embedded in an integrated circuit while avoiding the introduction of noise from such tolerance into the power rails.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Detailed Description of a Preferred Embodiment of the Invention

Figure 1:
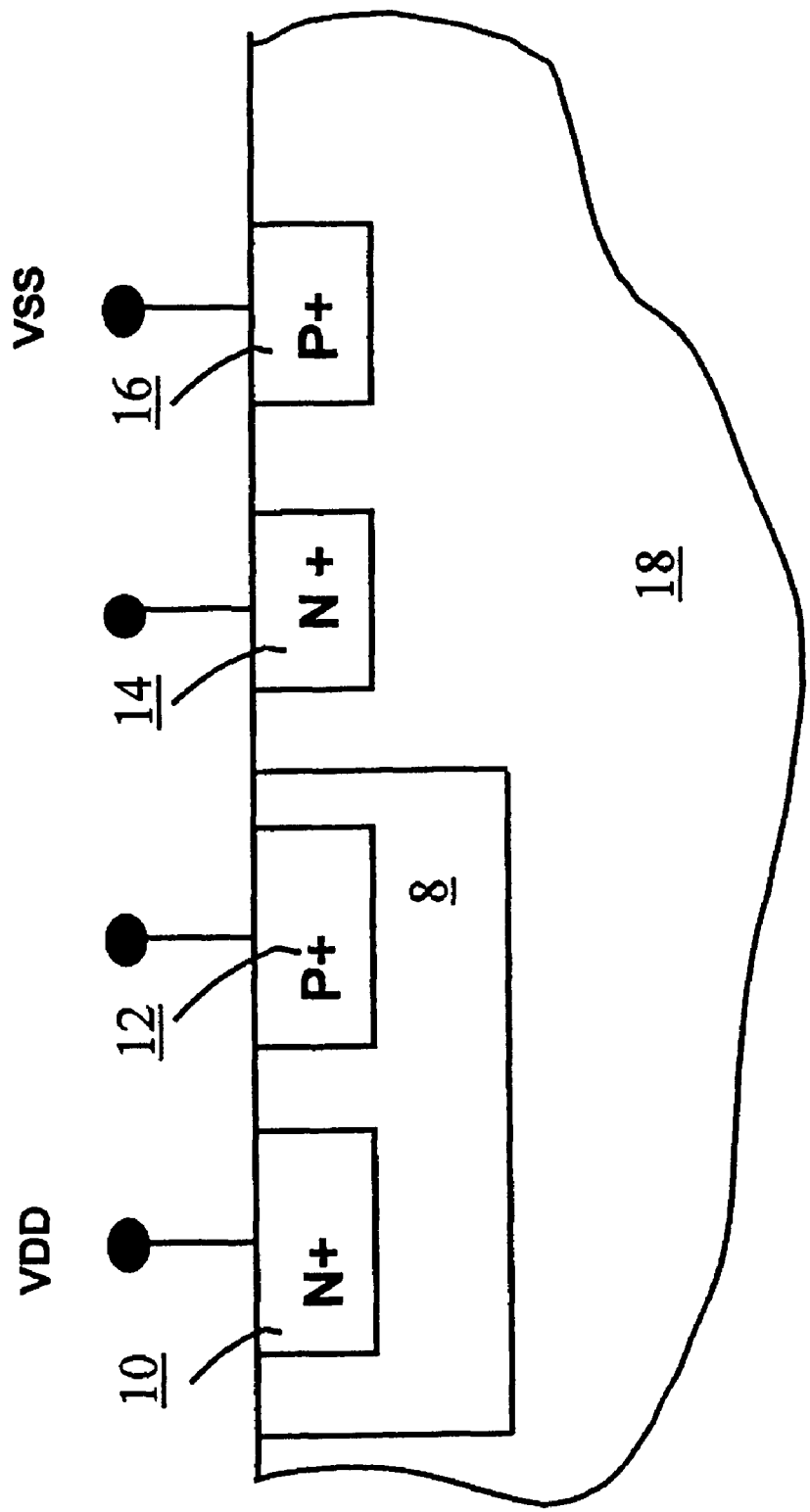
FIG. 1 is a cross section diagram illustrating a parasitic latchup structure environment in an integrated circuit.

Reference now being made to FIG. 1, a cross section diagram is shown illustrating a parasitic latchup structure environment in an integrated circuit. The integrated circuit includes a substrate 18 having an n-well region 8 with a well contact 10.

N-well region 8 can represent a diffused well, a retrograde well, a subcolector, or other vertical modulated wells. Substrate 18 can represent a p-well, a p- epi/p+ substrate, a p-wafer with a p+ buried layer, or other known substrate doping profiles.

Located within n-well region is p-doped shape 12 that can be used to form a p-channel MOSFETs, p-resistors, p/n diode, an ESD element or a base region of a npn bipolar. Also located within substrate 18 is n-doped region 14 that can be used to form an n-channel MOSFETs, a n-resistor, a diode, an ESD element or a collector of a npn transistor, or any other structure requiring a n-doped region. Substrate 18 also includes a substrate contact 16. It should also be noted that power (VDD) and ground (VSS) are applied to well contact 10 and substrate contact 16, respectively. The structure illustrated in FIG. 1 demonstrates the ease with which a parasitic pnpn structure can be formed in either a CMOS or BiCMOS technology from the p-doped shape 12, the n-well 8, substrate 18 and n-region 14. The parasitic pnpn structure can cause undesirable latchup and/or noise problems.

In the above configuration where there are connections (10 and 16) directly to the power grid, noise is able to leave the area of the circuit in which it is generated and is injected into the power domain (e.g. VSS or VDD) of the chip. Unfortunately, the noise level can become significant enough to impact the noise floor of adjacent circuits on the same power grid. Furthermore, allowing the injection into the substrate region or well region can initiate a latchup state. For example, if region 14 is grounded and a positive pulse is applied to p-region 12, latchup can occur. In further example, negative pulses can initiate a latchup between region 12 and 14. In addition, a negative undershoot on region 14 can lead to noise injection into the substrate that can be absorbed by n-well contact region 10 and by substrate contact region 16.

Figure 2:
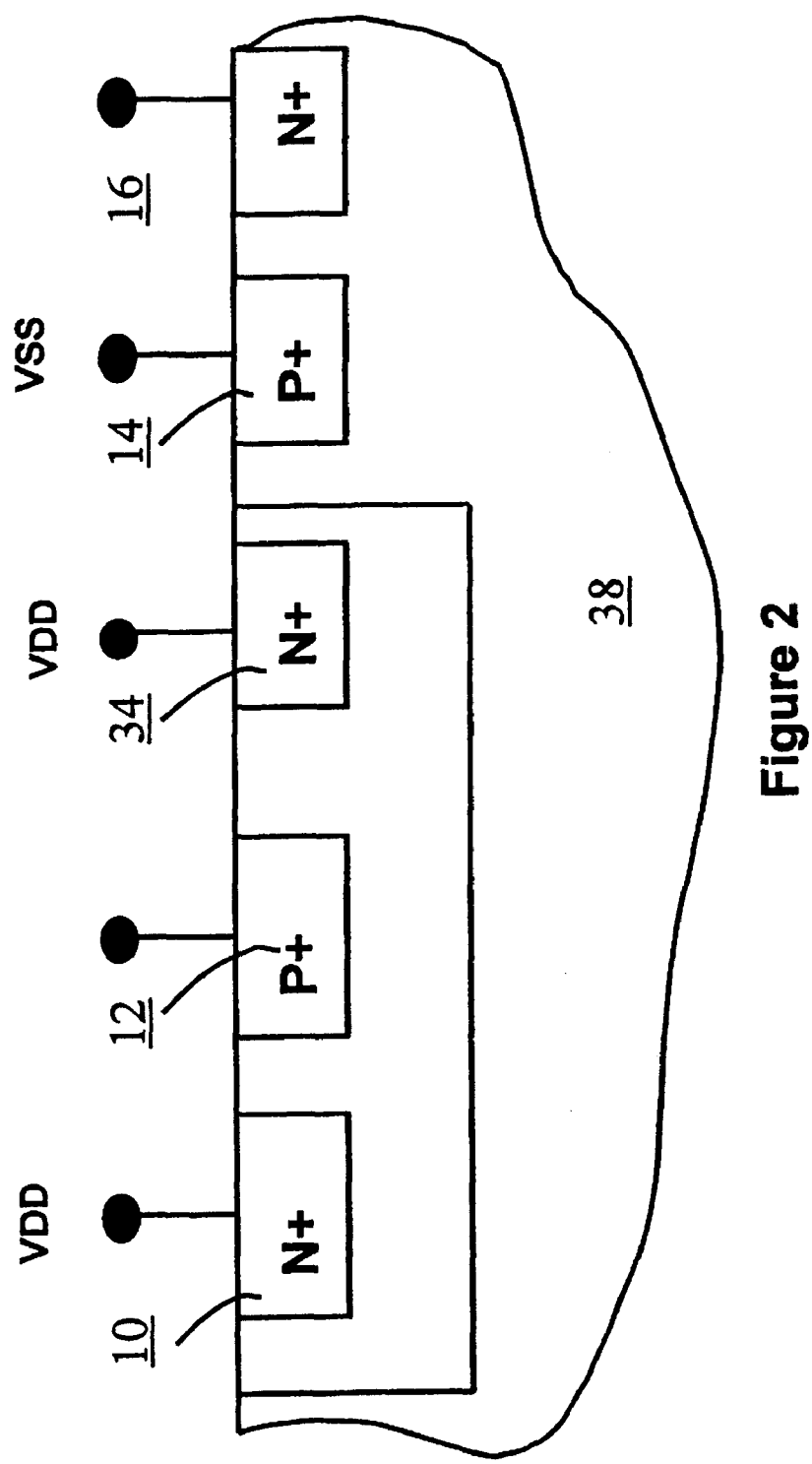
FIG. 2 is a cross section diagram illustrating an example of a parasitic latchup structure in an integrated circuit.

Reference now being made to FIG. 2, a cross section diagram is shown illustrating an example of a parasitic latchup structure in an integrated circuit. This example is similar to that shown in FIG. 1 with the addition of a new guard ring structure 34 to the N-well. Guard ring structure 34 is intended to improve latchup tolerance or sensitivity. Guard ring structure 34 will typically be connected to a power rail (e.g. VDD) with a salicided contact area and contacts to provide a low resistance path to VDD. In this example, the guard ring 34 improves the latchup tolerance, however, the overshoot noise which can initiate the latchup is injected into the ground rail. (VSS), and possible spread to other circuits.

As illustrated in the prior FIGS. 1–2, solutions for improving latchup tolerance have been used, however, these circuits introduce noise into the power rails (e.g. VDD or VSS) which is also undesirable. The present invention provides a solution for improving latchup tolerance and at the same time limiting the amount of noise introduced into the power rails.

Figure 3:
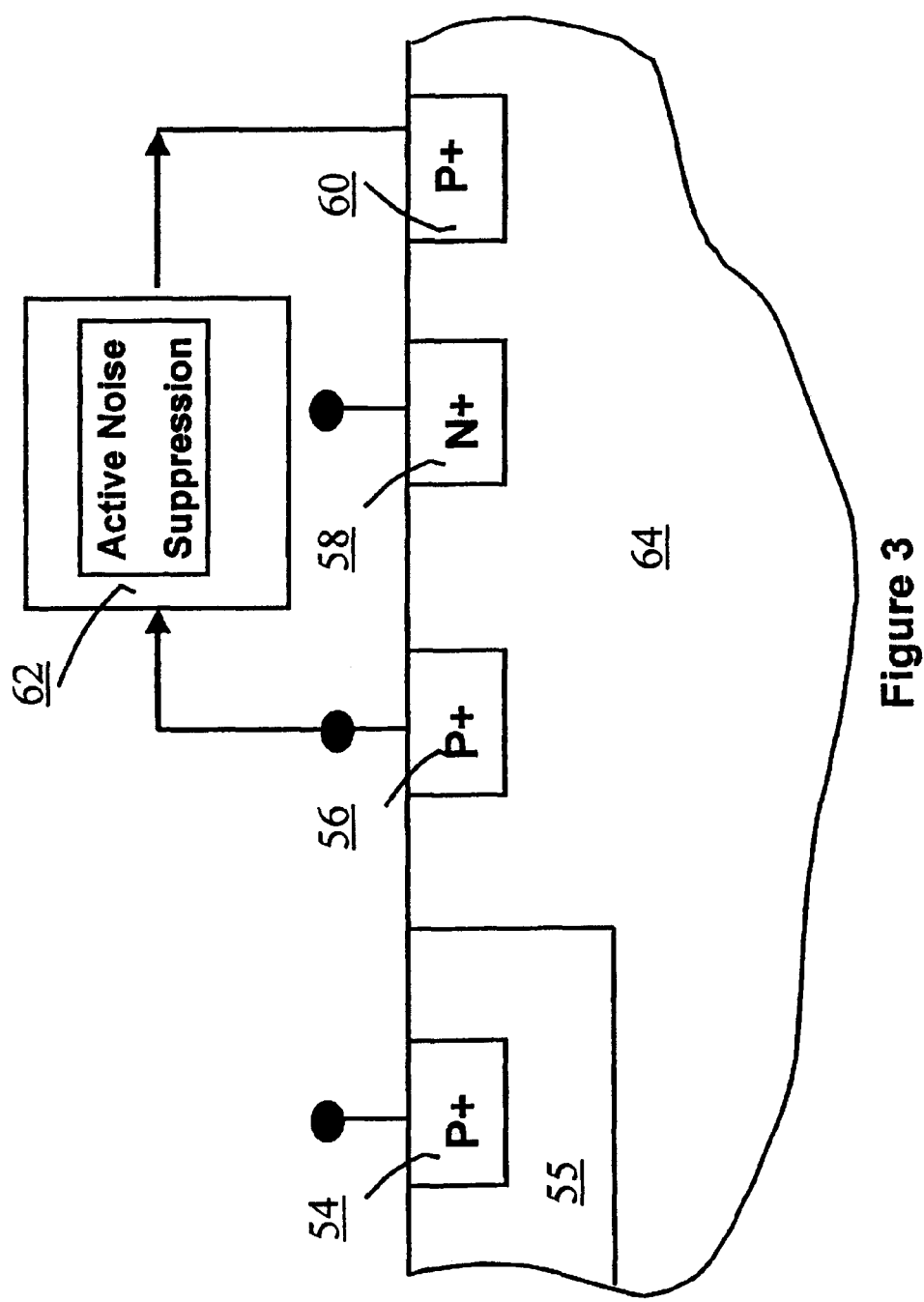
FIG. 3 is a cross section diagram illustrating an example of the how the present invention can be implemented within an integrated circuit.

Reference now being made to FIG. 3, a cross section diagram is shown illustrating an example of the how the present invention can be implemented within an integrated circuit. The integrated circuit includes a p+ region 54 contained with a well region 55, a substrate 64, an n-region 58 in the substrate, and a substrate contact 60 (noise suppression collecting structure). In this particular embodiment, a p-region 56 (noise suppression collecting structure) is placed within the parasitic pnpn structure (60, 58, 54). In addition, an active noise suppression circuit 62 is also added with an input connected to p-region 56, and an output connected to substrate contact 60.

P-region 56 can be a guard ring which is not connected to the ground potential, or any additional shape that improves latchup tolerance. A guard ring is a structure which collects minority carriers or obstructs the flow of minority carriers in the substrate. Any current or voltage signal intiated on p-region 56 is directed to the active noise suppression circuit 62. Noise suppression circuit 62 inverts the directed signal and applies the inverted signal to the region of the substrate where voltage increase or decrease has occurred locally in the substrate 64. By using the Noise suppression circuit 62, the signal produced from electrical overshoot or noise injection does not directly feed directly into the ground or power rails.

Figure 4:
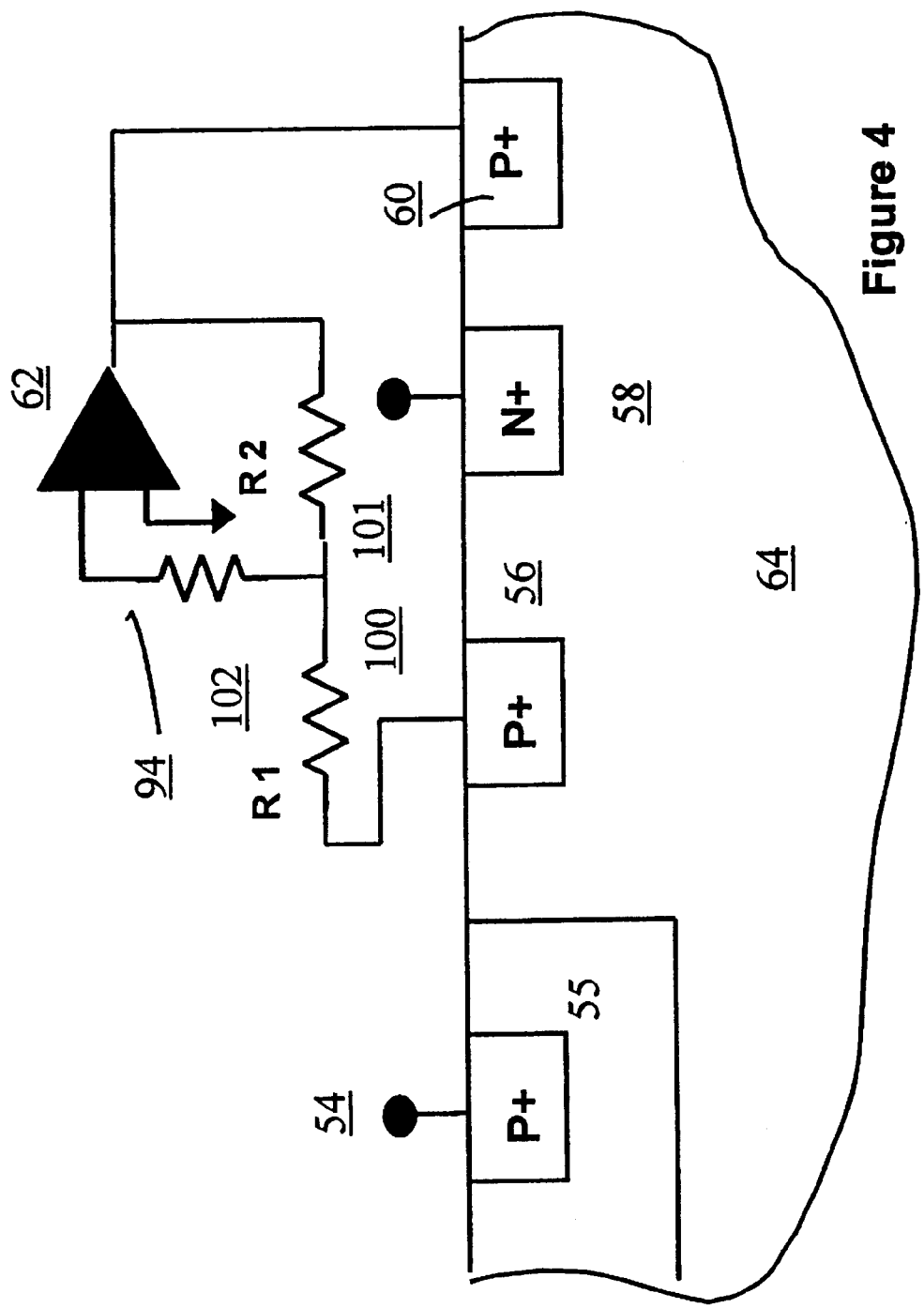
FIG. 4 is a cross section diagram illustrating an example of how the noise suppression circuit of FIG. 3 can be implemented according to the teachings of the present invention.

Reference now being made to FIG. 4, a cross section diagram is shown illustrating an example of how the noise suppression circuit 62 of FIG. 3 can be implemented according to the teachings of the present invention. In this example, the noise suppression circuit 62 is illustrated as an inverting amplifier 94 coupled to resistors 100, 101 and 102 as shown.

Figure 5:
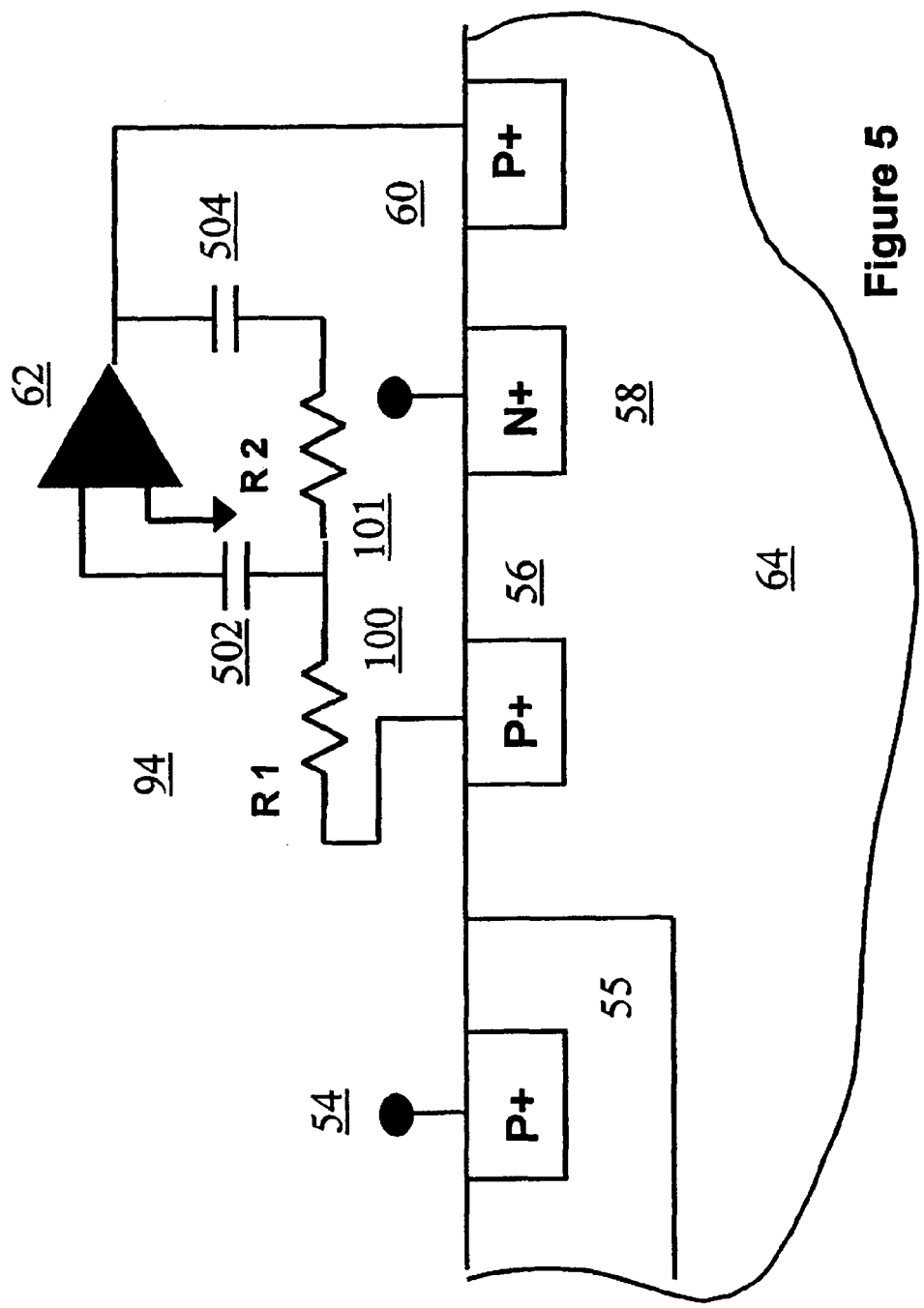
FIG. 5 is a cross section diagram illustrating an additional example of how the noise suppression of FIG. 3 can be implemented according to the teachings of the present invention.

Reference now being made to FIG. 5, a cross section diagram is shown illustrating an additional example of how the noise suppression circuit 62 of FIG. 3 can be implemented according to the teachings of the present invention. The noise suppression circuit 62 is identical to that shown in FIG. 4 with the addition of capacitive elements 102 and 103.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An integrated circuit comprising:
 a first structure forming a pnp parasitic;
 a second structure forming npn parasitic in a location sufficient to form a parasitic pnpn structure with the first structure;
 a noise suppression collecting structure located within the parasitic pnpn structure for receiving latchup current; and
 a noise suppression circuit for receiving the latchup current and inverting the received latchup current.

2. The integrated circuit of claim 1 further comprising:
 a current receiving structure located local to the parasitic pnpn structure for receiving the inverted latchup current aid providing the inverted latchup current to the substrate.

3. The integrated circuit of claim 2 wherein the npn structure is formed from a p doped substrate.

4. The integrated circuit of claim 3 wherein the substrate is a common substrate.

5. An integrated circuit comprising:
 a p-doped substrate;
 a n well structure located in the substrate;
 a first p+ structure located in the n well structure;

a n doped structure located in the substrate to form a parasitic pnpn structure from the substrate, the n well and the first p+ structure, a second p+ structure located in the substrate adjacent to the n well structure;

a third p+ structure located in the substrate adjacent the n doped structure; and a noise reduction circuit for receiving latchup current from the second p+ structure, inverting the received latchup current, and providing the inverted latchup current to the third p+ structure.

* * * * *